US012686164B2

(12) United States Patent
Huttunen et al.

(10) Patent No.: US 12,686,164 B2
(45) Date of Patent: Jul. 21, 2026

(54) ROLL-TO-ROLL-IMPRINTING

(71) Applicant: Teknologian tutkimuskeskus VTT Oy, Espoo (FI)

(72) Inventors: Olli-Heikki Huttunen, Oulu (FI); Jussi Hiltunen, Oulu (FI); Jarno Petäjä, Oulu (FI); Johanna Hiitola-Keinänen, Oulu (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 300 days.

(21) Appl. No.: 18/032,859

(22) PCT Filed: Oct. 19, 2021

(86) PCT No.: PCT/FI2021/050696
§ 371 (c)(1),
(2) Date: Apr. 20, 2023

(87) PCT Pub. No.: WO2022/084585
PCT Pub. Date: Apr. 28, 2022

(65) Prior Publication Data
US 2023/0398728 A1      Dec. 14, 2023

(30) Foreign Application Priority Data
Oct. 21, 2020    (FI) ..................................... 20206041

(51) Int. Cl.
*G03F 7/00*        (2006.01)
*B29C 35/08*       (2006.01)
(Continued)

(52) U.S. Cl.
CPC ........ *B29C 59/046* (2013.01); *B29C 35/0805* (2013.01); *G03F 7/0002* (2013.01);
(Continued)

(58) Field of Classification Search
CPC ....................................................... G03F 7/002
See application file for complete search history.

(56) References Cited

U.S. PATENT DOCUMENTS 3,635,609  A  *  1/1972  Balamuth ............... B29C 59/02
                                                        425/303
2009/0130607  A1     5/2009  Slafer
                    (Continued)

FOREIGN PATENT DOCUMENTS

CN       110962450  A      4/2020
JP      2008-284822  A     11/2008
                    (Continued)

OTHER PUBLICATIONS

Dumond et al., "High resolution UV roll-to-roll nanoimprinting of resin moulds and subsequent replication via thermal nanoimprint lithography", Nanotechnology, 2012, 485310, vol. 23, total 9 pages.
(Continued)

*Primary Examiner* — Andrew D Graham
(74) *Attorney, Agent, or Firm* — Birch, Stewart, Kolasch & Birch, LLP

(57)                    ABSTRACT

The present invention relates to roll-to-roll surface patterning by imprint method. A film of liquid phase resist is coated on a running web and subsequently brought into contact with a rolling replication tool with patterned features on its outer surface. In a simultaneous step, resist is 5 cured typically by heat or UV-light and patterned features on the rolling replication tool are replicated into the resist film during the contact with the replication tool. A major deficiency of conventional roll-to-roll imprinting is the generation of defects in the patterns due to trapped air. To overcome this limitation, the present invention describes a method and 10 apparatus to perform roll-to-roll imprinting under reduced-pressure or vacuum conditions.

8 Claims, 2 Drawing Sheets

(51) Int. Cl.

| | | |
|---|---|---|
| *B29C 59/04* | (2006.01) |
| *B29C 59/02* | (2006.01) |
| *B29L 7/00* | (2006.01) |
| *B82Y 40/00* | (2011.01) |

(52) U.S. Cl.
CPC .. *B29C 2059/023* (2013.01); *B29C 2791/004* (2013.01); *B29L 2007/001* (2013.01); *B82Y 40/00* (2013.01)

(56)                    References Cited

U.S. PATENT DOCUMENTS

| | | | | |
|---|---|---|---|---|
| 2009/0315212 | A1* | 12/2009 | Minoura | B29C 37/0007 425/112 |
| 2011/0001264 | A1* | 1/2011 | Minoura | B29C 59/04 264/293 |
| 2011/0254205 | A1 | 10/2011 | Inamiya et al. | |
| 2014/0232037 | A1* | 8/2014 | Kreindl | B82Y 10/00 264/219 |
| 2014/0252679 | A1* | 9/2014 | Hwang | B29C 59/046 264/293 |
| 2014/0305904 | A1* | 10/2014 | Lan | G03F 7/0002 216/41 |
| 2014/0329028 | A1* | 11/2014 | Gu | B29C 70/78 118/641 |
| 2015/0109234 | A1 | 4/2015 | Lotz et al. | |
| 2016/0101599 | A1 | 4/2016 | Kaiser et al. | |
| 2018/0304521 | A1* | 10/2018 | Kokubo | B29C 35/10 |

| | | | | |
|---|---|---|---|---|
| 2019/0291498 | A1* | 9/2019 | Lister | B42D 25/41 |
| 2020/0165721 | A1 | 5/2020 | Morrison et al. | |
| 2020/0346396 | A1* | 11/2020 | Power | B41M 1/24 |
| 2021/0341833 | A1* | 11/2021 | Sreenivasan | G03F 7/0002 |
| 2022/0043339 | A1* | 2/2022 | Huttunen | B29C 59/02 |

FOREIGN PATENT DOCUMENTS

| | | | |
|---|---|---|---|
| JP | 2009-255411 | A | 11/2009 |
| JP | 2010-80680 | A | 4/2010 |
| JP | 2013-180507 | A | 9/2013 |
| JP | 2015-501550 | A | 1/2015 |
| JP | 2016-7767 | A | 1/2016 |
| JP | 2016-541044 | A | 12/2016 |
| WO | WO 2015/055830 | A1 | 4/2015 |
| WO | WO 2020/120836 | A1 | 6/2020 |

OTHER PUBLICATIONS

International Search Report, issued in PCT/FI2021/050696, PCT/ISA/210, dated Jan. 24, 2022.
Office Action for FI 20206041 dated Jun. 3, 2023.
Office Action for FI 20206041 dated May 18, 2021.
Written Opinion of the International Searching Authority, issued in PCT/FI2021/050696, PCT/ISA/237, dated Jan. 24, 2022.
Finnish Office Action for Finnish Application No. 20206041, dated May 22, 2024.
Japanese Office Action for Japanese Application No. 2023-524386, dated Jul. 1, 2025, with English translation.

* cited by examiner

ROLL-TO-ROLL-IMPRINTING

CROSS REFERENCE TO RELATED APPLICATIONS

This application is the National Phase of PCT/FI2021/050696 filed on Oct. 19, 2021, which claims priority under 35 U.S.C. § 119 (a) to patent application No. 20206041 filed in Finland on Oct. 21, 2020, all of which are hereby expressly incorporated by reference into the present application.

FIELD

The present invention relates to a system and a method related to making microscale and nanoscale structures. More particularly, the present invention discloses a system and a method that can be used for manufacturing rapidly and continuously micro- and nanostructures for various purposes, while eliminating air bubble formation of a resist.

BACKGROUND

Imprinting, also referred to as nanoimprinting, is a method of fabricating micro and nanometer scale patterns and/or structures. Imprinting process is low cost, high throughput and capable of high resolution due to direct mechanical deformation of resist materials. Imprinted patterns and/or structures have wide applications for example in biomedicine, micro- and nanofluidics, data storage, electronics and microelectromechanical devices. Resulting structures may be fully or at least partially flexible or stretchable or rigid.

Roll-to-roll imprinting has been developed to enable high-speed processing to respond to demand for low-cost patterning. A film of resist, typically a monomer or polymer formulation, is coated onto a substrate web made of any suitable material that can be provided on roll and does not inhibit curing process of the resist material. For example, the substrate may be made from plastics, such as polyethylene terephthalate (PET), cyclic olefin copolymer (COC) or polycarbonate (PC), but it may also be made of paper, cardboard, laminate, metal etc., or a combination of any of these. Then a cylindrical replication tool, which has predefined topological mold patterns on its outer surface, is brought into contact with the resist and they are pressed together under a certain pressure. During patterning phase of the imprinting process the resist is in at least partially liquid form. During the contact time with the replication tool, the resist is cured by heat, UV light, IR or other suitable electromagnetic radiation.

One problem in imprinting is that gas bubbles or air bubbles may be trapped in the resist or between the resist and the replication tool, resulting to defective imprinting products. Solutions have been provided earlier for reducing or eliminating bubble formation in batch type imprinting. However, no working solution has been provided for reducing or eliminating bubble formation in roll-to-roll imprinting.

DESCRIPTION OF THE RELATED ART

Patent SG10201403829 discloses an imprinting apparatus for ultraviolet roll-to-roll imprinting. Air trapping in the plastic web is minimized by using a gaseous environment creation unit that creates a pseudo-enclosure with a local gas environment by injecting exotic gas at the point where a resist, a plastic web and a mold are joined together. Bubble formation and oxygen inhibition is thus partially minimized by excluding air during the contract of the plastic web and the imprint drum or the sheet mold.

J. Dumond, et al. "High resolution UV roll-to-roll nanoimprinting of resist molds and subsequent replication via thermal nanoimprint lithography", in Nanotechnology 23(48):485310, November 2012, proposes that various solutions for inhibiting gas trapping for batch mode UV nanoimprinting may be adapted for roll-to-roll nanoimprinting.

SUMMARY

An object is to provide an apparatus and a method so as to solve the problem of reducing air bubble formation in the resist in roll-to-roll imprinting. The objects of the present invention are achieved with an apparatus and a manufacturing method where the manufacturing method enables manufacturing of nanostructures as described herein.

The preferred embodiments of the invention are disclosed in the dependent claims.

According to a first aspect, a roll-to-roll imprinting apparatus is provided. The apparatus comprises an unwinding unit configured to unwind a substrate web, and, optionally, a substrate web pre-treatment unit configured to pre-treat the substrate web. The apparatus also comprises a mixing and coating unit configured to prepare a resist by mixing at least two component substances, or to obtain and optionally stir a single-component resist substance, and to coat the substrate web with the resist to form a resist film. The apparatus also comprises an impression roller unit configured to pattern the resist film in a continuous process by applying a pressure on the resist film by pressing the resist film between the substrate web and a mold placed at or formed on the outer surface of a rolling replication tool, the mold thereby defining a plurality of nanostructures in the resist, a curing unit associated with the impression roller unit and configured to at least partially cure the patterned resist comprising the mold-patterned nanostructures prior to detaching the patterned resist from the mold, and a rewinding unit configured to rewind the substrate web with the cured nanostructures.

The apparatus further comprises a reduced-pressure chamber into which the unwinding unit, the optional pre-treatment unit, the mixing and coating unit, the impression roller unit, the curing unit and the rewinding unit are enclosed when in operation, and in which reduced-pressure chamber air pressure during operation of said enclosed units is between atm and 0.5 atm, preferably between 0.1 atm and 0.5 atm.

According to a second aspect, the roll-to-roll imprinting apparatus further comprises a liner unwinding unit enclosed in the reduced-pressure chamber when in operation and configured to unwind a protective liner from the unwound substrate web before pre-treating the substrate web by the pre-treatment unit, and/or before coating the substrate web with the resist film by the mixing and coating unit, and/or a liner rewinding unit enclosed in the reduced-pressure chamber when in operation and configured to feed a protective liner on top of the cured nanostructure on the substrate web before rewinding the substrate web with the cured nanostructures. Said liner unwinding unit and/or the liner rewinding unit are respectively enclosed within the reduced-pressure chamber during operation thereof.

According to a third aspect, the impression roller unit is configured to enable adjustment of at least one of infeed angle of the substrate web coated with the resist film, pressure applied to the resist when it is pressed between the mold and the substrate web, curing temperature used for curing the resist, intensity of radiation used for curing the resist, and demolding angle of the substrate web with the at least partially cured resist.

According to a fourth aspect, said at least two component substances of the resist or said single-component resist substance are/is fed to the mixing and coating unit by respective one or more pipelines, each coupled to a respective storage container. Said storage container is one of within the reduced-pressure chamber, and external to the reduced-pressure chamber. Internal pressure within the storage container is between 0 atm and 0.5 atm, preferably between 0.1 atm and 0.5 atm, and more preferably equal to the air pressure within the reduced-pressure chamber during operation of the roll-to-roll imprinting apparatus.

According to a fifth aspect, the resist is an uncured monomer or pre-polymer mixture prepared by mixing said at least two component substances, or the resist is single-component resist substance.

According to a first method aspect, a roll-to-roll nanostructure manufacturing method is provided. The method comprises steps of unwinding a substrate web, optionally pre-treating the substrate web, preparing a resist by mixing at least two component substances, or obtaining and optionally stirring a single-component resist, coating the substrate web with the resist to form a resist film, patterning the resist film in a continuous process by applying a pressure on the resist film by pressing the resist film between the substrate web and a mold placed at or formed on the outer surface of a rolling replication tool, thereby the mold defining a plurality of nanostructures in the resist, curing the patterned resist film comprising the mold-patterned nanostructures, wherein the curing at least partially occurs prior to detaching the patterned resist from the mold, and rewinding the substrate web with the cured nanostructures. The method comprises enclosing apparatus for performing the steps in a reduced-pressure chamber, reducing air pressure in the reduced-pressure chamber, so that air pressure within the reduced-pressure chamber is between 0 atm and 0.5 atm, preferably between 0.1 atm and 0.5 atm, and performing the steps of the roll-to-roll nanostructure manufacturing method by said apparatus enclosed in the reduced-pressure chamber after said reducing of the air pressure.

According to a second method aspect, the method further comprises at least one of unwinding a protective liner from the unwound substrate web before performing the optional pre-treatment the substrate web by the pre-treatment unit and/or before coating the substrate web with the resist film, and feeding a protective liner on top of the cured nanostructure on the substrate web before rewinding the substrate web with the cured nanostructures. Apparatus for performing said unwinding the protective liner and/or said feeding the protective liner is enclosed within the reduced-pressure chamber, and said steps of unwinding the protective liner and/or said feeding the protective liner are performed within the reduced-pressure chamber after said reducing air pressure.

According to a third method aspect, the method further comprises at least one of adjusting an infeed angle of the substrate web coated with the resist film, adjusting a pressure applied to the resist when it is pressed between the mold and the substrate web, adjusting a curing temperature used for curing the resist, adjusting an intensity of radiation used for curing the resist, and adjusting a demolding angle of the substrate web with the at least partially cured resist.

According to a fourth method aspect, the method further comprises obtaining each of the substances of the resist to be mixed from a respective storage container, wherein said storage container is within the reduced-pressure chamber, or said storage container is external to the reduced-pressure chamber, wherein internal pressure within the storage container is 0 atm and 0.5 atm, preferably between 0.1 atm and 0.5 atm, and more preferably equal to the air pressure within the reduced-pressure chamber during operation of the roll-to-roll imprinting apparatus.

According to a fifth method aspect, the resist is an uncured monomer or pre-polymer mixture prepared by mixing said at least two component substances, or the resist is single-component substance.

According to another aspect, nanostructure is provided, wherein the nanostructure is produced by the manufacturing process according to any the above method aspects, wherein the nanostructure comprises any of an optical nanostructure, an electronic nanostructure, a data storage nanostructure, a microelectro-mechanical nanostructure, a micro- or nanofluidics nanostructure and a biomedical nanostructure.

The present invention is based on the idea of placing the entire roll-to-roll imprinting process performing apparatus in a reduced-pressure chamber, which enables performing the imprinting process in a reduced-pressure or vacuum atmosphere.

The present invention has the advantage that it enables imprinting high-quality nano- and/or microstructures with high production speed using a substrate web.

BRIEF DESCRIPTION OF THE DRAWINGS

In the following the invention will be described in greater detail, in connection with preferred embodiments, with reference to the attached drawings, in which.

DETAILED DESCRIPTION

The term nanostructure(s) refers to nano- and/or micropattern(s) and structure(s).

Figure 1:
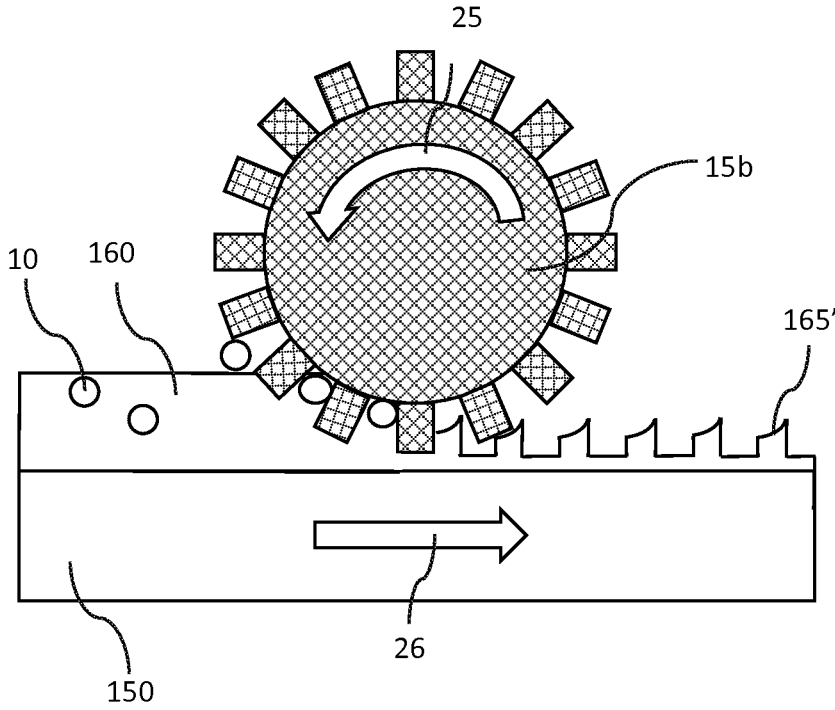
FIG. 1 illustrates operation of a rolling replication tool in normal ambient atmosphere.

The FIG. 1 illustrates schematically operation of a rolling replication tool (15b) in normal ambient atmosphere. A mold for defining one or more nanostructures is placed at or formed on the outer surface of the rolling replication tool, typically formed as a cylinder, which is rotated about its central axis during the imprinting process. This simplified illustration shows the mold as a plurality of "teeth" on the outer surface of the rolling replication tool (15b). Rolling direction of the cylinder-formed rolling replication tool (15b) about its central symmetry axis is illustrated by the curved arrow (25). A substrate web (150) is coated with a resist (160). The resist, in particular a resist prepared from at least two component substances, may comprise for example uncured monomer or pre-polymer mixture, which is at least partially in liquid form. Alternatively, the resist may comprise of be of any single-component resist known in the art, such as liquid silicone rubber. The substrate web with the resist (160) is conveyed, as illustrated with arrow 26, past the rolling replication tool (15b) so that the resist (160) is pressed between the rolling replication tool (15b)

and the substrate web (150) with predefined pressure. A mold patterned on the outer surface of the rolling replication tool (15b) is thus pressed against the resist (160), which thereby takes the form defined by the mold pattern. The patterned resist (165') is cured to fix the imprinted nano-structure. Curing occurs at least partially before the patterned resist (165') is detached from the mold to avoid deformation of the nanostructure generated in the resist during detaching.

When the imprinting process is performed in normal ambient atmosphere, with about 1 atm pressure, air bubbles (10) may be trapped within the resist (160) during and/or after coating the resist layer on the substrate and/or between the resist and the mold placed at or formed on the outer surface of the rolling replication tool (15b). Such trapped air bubbles (10) cause deformation of the nanostructures in the patterned resist (165'). This is a major quality problem in rolling type imprinting, which enables higher speed imprinting with lower cost when compared to batch type imprinting.

Figure 2:
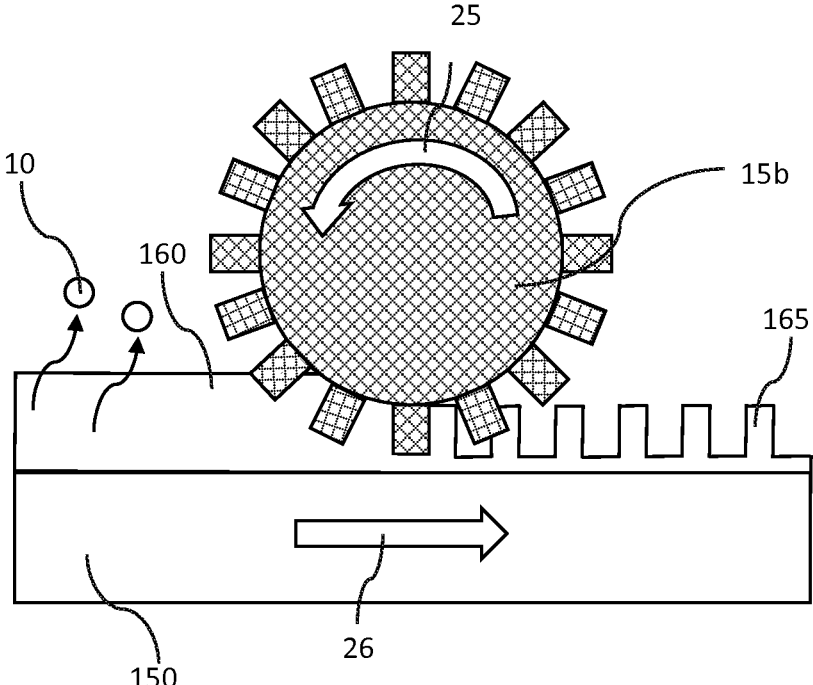
FIG. 2 illustrates operation of a rolling replication tool in reduced pressure atmosphere or vacuum.

The FIG. 2 illustrates schematically phases of a imprinting process that uses a rolling replication tool (15b) in reduced pressure atmosphere or in vacuum. With reduced pressure atmosphere we refer to atmosphere with air pressure significantly lower than pressure of normal ambient atmosphere (1 atm), preferably air pressure at or below 0.5 atm. The imprinting process itself is basically the same as in the FIG. 1. However, in the reduced pressure atmosphere or in vacuum, air bubbles (10) trapped in the resist are removed and no air bubbles become trapped between the mold at the surface of the rolling replication tool (15b) and the resist (160). Thus, resulting nanostructures in the cured resist (165) are essentially free from deformations caused by air bubbles. Thus, performing the imprinting process in low ambient pressure or vacuum significantly improves quality of the products manufactured using the imprinting process.

In most applications, reduced pressure is preferred over vacuum. Reduced pressure atmosphere is easier to achieve, and a vacuum may even cause problems in the resist. For example, vacuum may cause vaporizing of components of the resist material, which creates a new source of gas bubbles causing quality problems similar to those caused by air bubbles. Preferable air pressure in the reduced pressure atmosphere is between atm and 0.5 atm, but in some processes, even lower air pressures or vacuum may be preferred or required for best results.

Figure 3:
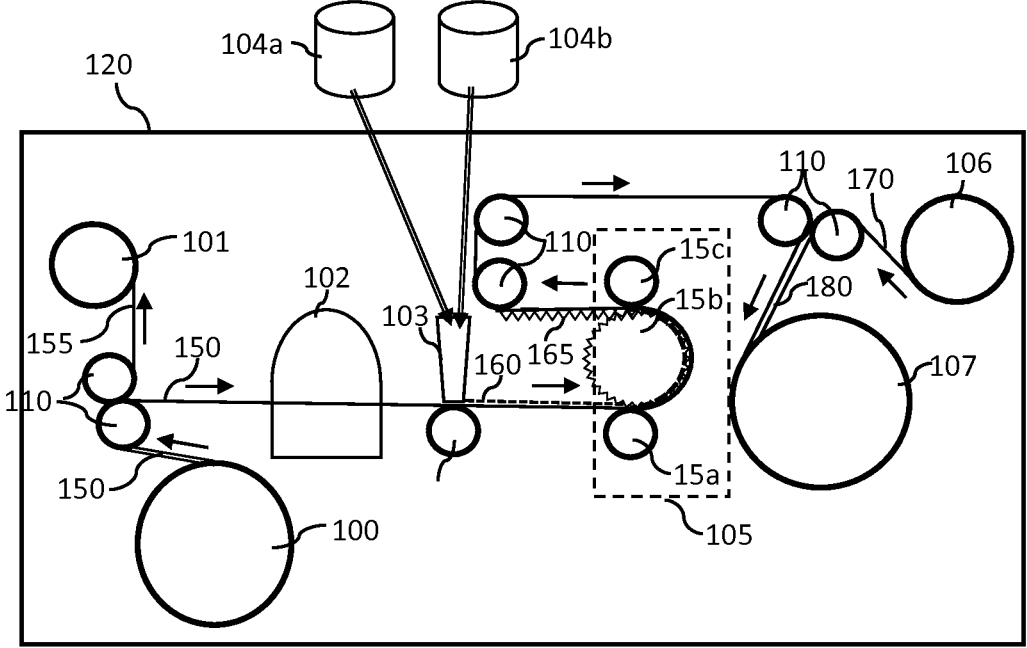
FIG. 3 is a schematic illustration of an exemplary implementation of roll-to-roll imprinting process according to the invention.

The FIG. 3 shows a schematic illustration of the preferred embodiment of the invention.

The substrate web (150), referred to in short as the substrate (150) is brought into the process on an unwinding unit (100). The substrate (150) may be covered with a protective liner (155), as illustrated with the double line exiting the unwinding unit (100). The protective liner (155) is removed to expose the substrate material to processing, and the protective liner (155) is rewound by a liner rewinding unit (101). The imprinting process is then applied to the substrate (150).

The substrate (150) may be optionally pre-treated by a pre-treatment unit (102) for pre-treating the substrate (150) for the imprinting before the substrate (150) is coated with the resist (160). For example, the pre-treatment unit (102) may comprise a corona unit and/or a plasma handling unit for treating the substrate (150). Corona treatment and plasma treatment are known in the art for improving subsequent wetting of the substrate web (150) with the resist (160) and/or adhesion between the substrate web (150) and the resist (160). The pre-treatment unit (102) may be alternatively omitted or simply not used, if not required.

In the current example a mixing and coating unit (103) receives component substances or a single-component resist substance for preparing the resist from one or more external storage containers (104a, 104b). The one or more external storage containers are preferably in the same pressure as the imprinting apparatus during operation. This ensures controllable coating of the resist material and reduces air trapping inside the resist. Thus, amount of gas bubbles in the resist component substances or in the single-component resist substance and thereby amount of gas in the resist may be reduced and formation of bubbles during mixing the resist is also reduced. If the resist is a mixture of at least two component substances, received component substances are mixed by the mixing and coating unit (103) for preparing the resist (160). A single-component resist, such as a liquid silicone rubber, does not require mixing, but it may be optionally stirred by the mixing and coating unit. A thin film of the resist (160) may be coated onto the substrate using for example a knife, a spiral bar or any other applicable method as known in the art. The resist (160) coated substrate (150) is then fed into an impression roller unit (105) comprising a set of impression rollers (15a, 15c) and a rolling replication tool (15b). Mold for defining the nanostructures is attached to or patterned on the outer surface of the rolling replication tool (15b) that is towards the resist so that the resist is pressed between the substrate web (150) and the rolling replication tool (15b) to generate pressure on the resist material pressed against the mold pattern. The patterns are typically micro- and/or nano-scale features, but may also be or comprise essentially flat patterns and/or larger than micro-scale features. The mold thus forces the resist into the wanted pattern, thus causing the resist to take form of the wanted topology. Impression rollers (15a, 15c) of the impression roller unit (105) are preferably adjustable so that both the infeed angle and the demolding angle and/or pressure can be adjusted. Before releasing the resist from the mold and the rolling replication tool (15b), the resist is at least partially cured by a curing unit (not shown) to fix the nanostructure. Curing may be implemented with any suitable curing method, depending on the resist. For example, thermal curing, ultraviolet light curing, infrared curing or any other suitable radiation curing may be applied that triggers the curing process, such as polymerization and/or crosslinking. Although curing of the nanostructure is initialized during the molding phase (patterning phase), it is sufficient for the nanostructure to be cured to the point that allows demolding it, in other words detaching it from the mold, without deforming due to the demolding, and the nanostructure may further cure after demolding.

In case of thermal curing, the curing temperature is preferably adjustable. The optimal curing temperature depends for example on the type of resist used and/or thickness of the resist layer and/or structural characteristics of the nanostructures and/or other processing parameters such as web speed. For example, when using silicone elastomer as the resist, the curing temperature is preferable between 135° C. and 165° C., depending on the type of silicone resist used. The nanostructure (165) on the substrate web (150) is then allowed to cool down, while conveyed forward. Likewise, in case of curing with other types of radiation, such as UV radiation, intensity of the radiation is preferably adjustable. Time period for curing may be adjusted for example by adjusting width of the sector of the rolling replication tool on which the curing occurs, and/or by adjusting rolling speed of the substrate.

The cured nanostructure carried by the substrate (150) may be protected with a protective liner (170) provided from a liner supply unit (106) before rewinding the liner protected substrate (180) with the nanostructure on a rewinding unit (107). A plurality of rollers (110) facilitate guiding the substrate web (150) through the entire process, ensuring that the substrate web (150) proceeds smoothly and is appropriately and evenly tensioned throughout the manufacturing process.

For inhibiting generation of air or gas bubbles in the resist during the imprinting process, the roll-to-roll imprinting apparatus is enclosed in a reduced-pressure or vacuum chamber (120), starting from the unwinding unit (100) and ending to the rewinding unit (107). If liners (155, 170) are utilized, the liner unwinding unit (101) and liner supply unit (106) are preferably also within the reduced-pressure chamber (120). The reduced-pressure or vacuum chamber is preferable coupled to at least one pump for evacuation of air and thus reducing the air pressure. As already mentioned above, pressure in the reduced-pressure chamber is preferably within a range between 0.1 atm and 0.5 atm. A vacuum may be applicable option, but not feasible for all types of resists, since some component materials in resists tend to vaporize in vacuum, which may generate gas bubbles within the resist itself. By performing the entire roll-to-roll imprinting process in controlled environment, the imprinting process can be run continuously in high volume without compromising quality of the generated nanostructures.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A roll-to-roll nanostructure manufacturing method comprising steps of:
   unwinding a substrate web;
   optionally pre-treating the substrate web;
   preparing a resist by mixing at least two component substances, or obtaining and optionally stirring a single-component resist;
   coating the substrate web with the resist to form a resist film;
   patterning the resist film in a continuous process by applying a pressure on the resist film by pressing the resist film between the substrate web and a mold placed at or formed on the outer surface of a rolling replication tool, thereby the mold defining a plurality of nanostructures in the resist;
   curing the patterned resist film comprising the mold-patterned nanostructures, wherein the curing at least partially occurs prior to detaching the patterned resist from the mold; and
   rewinding the substrate web with the cured nanostructures,
   enclosing apparatus for performing the steps in a reduced-pressure chamber,
   reducing air pressure in the reduced-pressure chamber, so that air pressure within the reduced-pressure chamber is between 0 atm and 0.5 atm, and
   performing the steps of the roll-to-roll nanostructure manufacturing method by said apparatus enclosed in the reduced-pressure chamber after said reducing of the air pressure.

2. The roll-to-roll nanostructure manufacturing method according to claim 1, wherein the method further comprises at least one of:
   unwinding a protective liner from the unwound substrate web before performing the optional pre-treatment the substrate web by the pre-treatment unit and/or before coating the substrate web with the resist film, and
   feeding a protective liner on top of the cured nanostructure on the substrate web before rewinding the substrate web with the cured nanostructures,
   wherein
   apparatus for performing said unwinding the protective liner and/or said feeding the protective liner is enclosed within the reduced-pressure chamber, and
   said steps of unwinding the protective liner and/or said feeding the protective liner are performed within the reduced-pressure chamber after said reducing air pressure.

3. The roll-to-roll nanostructure manufacturing method according to claim 1, wherein the method further comprises at least one of:
   adjusting an infeed angle of the substrate web coated with the resist film;
   adjusting a pressure applied to the resist when it is pressed between the mold and the substrate web;
   adjusting a curing temperature used for curing the resist;
   adjusting an intensity of radiation used for curing the resist; and
   adjusting a demolding angle of the substrate web with the at least partially cured resist.

4. The roll-to-roll nanostructure manufacturing method according to claim 1, further comprising:
   obtaining each of the substances of the resist to be mixed from a respective storage container, wherein said respective storage container is within the reduced-pressure chamber, or said respective storage container is external to the reduced-pressure chamber, wherein internal pressure within the storage container is between 0 atm and 0.5 atm.

5. The roll-to-roll nanostructure manufacturing method according to claim 1, wherein the resist is an uncured monomer or pre-polymer mixture prepared by mixing said at least two component substances, or the resist is single-component substance.

6. The roll-to-roll nanostructure manufacturing method according to claim 1, wherein the method comprises:
   reducing air pressure in the reduced-pressure chamber, so that air pressure within the reduced-pressure chamber is between 0.1 atm and 0.5 atm.

7. The roll-to-roll nanostructure manufacturing method according to claim 4, wherein internal pressure within the respective storage container is between 0.1 atm and 0.5 atm.

8. The roll-to-roll nanostructure manufacturing method according to claim 4, wherein internal pressure within the respective storage container is equal to the air pressure within the reduced pressure chamber during operation of the roll-to-toll imprinting apparatus.

* * * * *